United States Patent [19]
Dean

[11] Patent Number: 5,880,626
[45] Date of Patent: Mar. 9, 1999

[54] ACTIVE DAMPING FOR A DISK DRIVE WRITE CIRCUIT

[75] Inventor: Douglas Warren Dean, Eagan, Minn.

[73] Assignee: VTC, Inc., Bloomington, Minn.

[21] Appl. No.: 757,117

[22] Filed: Dec. 2, 1996

[51] Int. Cl.$^6$ ........................................... H03B 1/00
[52] U.S. Cl. ..................... 327/552; 327/110; 327/311; 360/46
[58] Field of Search ..................... 327/110, 551, 327/552, 553–559, 423, 424, 587, 589, 309, 310, 311, 318, 319, 321, 331; 360/46, 67, 68; 318/611, 620, 623

[56] References Cited

U.S. PATENT DOCUMENTS

| | | | |
|---|---|---|---|
| 2,892,165 | 6/1959 | Lidsay | 327/552 |
| 3,388,219 | 6/1968 | Davis | 327/552 |
| 3,593,113 | 7/1971 | Wiley | 327/552 |
| 3,704,656 | 12/1972 | Ogiso et al. | 327/423 |
| 4,218,950 | 8/1980 | Uetrecht | 327/552 |
| 5,350,997 | 9/1994 | Ghotbi et al. | 323/268 |
| 5,357,379 | 10/1994 | Gower | 360/46 |
| 5,363,249 | 11/1994 | Fitzmorris | 360/46 |
| 5,459,383 | 10/1995 | Sidman et al. | 318/611 |

*Primary Examiner*—Kenneth B. Wells
*Attorney, Agent, or Firm*—Kinney & Lange, P.A.

[57] ABSTRACT

An active damping system for reducing the ringing effects in write current signals flowing through a write head of a disk drive write circuit. The active damping system stores a voltage related to the write current, sinks write current from a terminal of the write head in response to a predetermined rate of increase in the stored voltage, and provides a high impedance to the terminal when the rate of increase of stored voltage is below the predetermined rate. The active damping system preferably includes a transistor connected between the write head terminal and a common electrical potential, a capacitor connected between the terminal and a base of the transistor, and a resistor connected between the base of the transistor and the common electrical potential.

10 Claims, 3 Drawing Sheets

ACTIVE DAMPING FOR A DISK DRIVE WRITE CIRCUIT

BACKGROUND OF THE INVENTION

The present invention relates to an active damping network, and more particularly to an active damping network for damping ringing effects in a write circuit for a disk drive.

Disk drives are employed to store large quantities of information in bits encoded on tracks of a disk as a series of logical 1's and 0's. These logical 1's and 0's are represented in bit cells, which are areas of uniform size along the length of a track of the disk. It is desirable that the information bits be encoded on the disk as densely as practical, so that a maximum amount of information may be stored. This can be achieved by increasing bit cell density on the disk, namely by reducing the size of bit cells along a particular track, thereby increasing the number of bit cells on the track. Increasing the number of bit cells per track increases the number of bits that can be encoded on each track, and therefore increases the amount of information stored.

Conventionally, logical 1's are recorded as transitions in magnetic flux on a magnetic disk for the given bit cell (the absence of a transition indicates a logical 0). These transitions are created by switching the write current polarity through the write head. Transitions representing logical 1's are preferably placed within each bit cell near the center of the bit cell, so that the data frequency (based on bit cell size and rotational speed of the disk) can be accurately locked by a phase-locked loop during recovery of data from the disk, and to ensure that bits are not encoded over a bit cell boundary during write operations. As bit cells are more densely packed on a track, placement of the transitions becomes even more important and difficult to precisely control. Thus, transition placement accuracy and bit cell density are two very important parameters in a write circuit for a disk drive.

Due to the inductive nature of a write circuit head and the output capacitances associated with the write circuitry, ringing effects occur in the write current signal which tends to delay the settling of the write current to its final DC value. These ringing effects adversely affect both transition placement and bit cell size concerns. One option when ringing effects are present is to simply wait for the write current to settle to its final DC value, and then enable the next transition for encoding a bit. This option means that bit cell duration must be increased to allow time for the write current to settle. While the accuracy of transition placement within bit cells in such a system will not be negatively affected by the ringing of the write current, the density of bit encoding by the write circuit is poor, in comparison to desired goals. Another option when ringing effects are present is to switch the write current before it has settled to its final value. This approach maintains acceptable encoding density, but results in decreased placement accuracy of bit encoding and hinders subsequent recovery of data from the disk. More particularly, if the write current has not fully settled from a prior transition, switching for the next transition might commence at different, uncontrolled, current levels, which results in sporadic placement of transitions in bit cells. Therefore, both options entail undesirable performance trade-offs where ringing effects are present.

One known solution to the ringing problem has been to connect a damping resistor across the terminals of the write head. The resistive damping reduces the settling time for the write current signal flowing through the head. However, resistive damping has several negative effects on the performance of the write circuit. Since some of the write current is diverted through the damping resistor, write current through the head is reduced. To achieve the desired value of write current through the head, more current must be generated to flow through both the head and the damping resistor. More importantly, the damping resistor slows the rise time for write current transitions. This can adversely affect bit cell density. While resistive damping does reduce settling time, the slower rise times may not be acceptable for high performance write circuits. Undershoot may also occur, which could result in loss of saturation of the head media or contribute to the problem of switching from uncontrolled current levels and result in sporadic bit placement in the bit cells. Thus, there is a need for a damping system in disk drive write circuitry which overcomes the problems of ringing and the shortcomings of resistive damping solutions.

SUMMARY OF THE INVENTION

An active damping assembly is provided for a disk drive write circuit that has a terminal for connection to a write head. The write circuit selectively directs write current through the write head in a first direction and in a second direction opposite the first direction. In one form of the invention, the active damping assembly includes a capacitive means that stores a voltage related to the write current. A transistor sinks write current in response to a predetermined rate of increase in the stored voltage. Discharge means discharges the voltage at the base of the transistor when the rate of increase of the stored voltage is below the predetermined rate.

In another form of the invention, the active damping assembly includes a transistor with its collector connected to the terminal and its emitter connected to a common electrical potential. A capacitor is connected between the terminal and the base. A resistor is connected between the base and the common electrical potential.

In yet another form of the invention, the disk drive write circuit has first and second terminals for connection to opposite sides of the write head. A first active damping assembly includes a first transistor with its collector connected to the first terminal and its emitter connected to a common electrical potential. A first capacitor is connected between the first terminal and the base of the first transistor. A first resistor is connected between the base of the first transistor and the common electrical potential. A second active damping assembly includes a second transistor with its collector connected to the second terminal and its emitter connected to the common electrical potential. A second capacitor is connected between the second terminal and the base of the second transistor. A second resistor is connected between the base of the second transistor and the common electrical potential.

In a preferred form of the invention, the write circuit includes an H switch having first, second, third and fourth transistors. The H switch is arranged so that an emitter of the first transistor and a collector of the second transistor are connected to a first terminal for connection to a first side of a write head. An emitter of the third transistor and a collector of the fourth transistor are connected to a second terminal for connection to a second side of the write head. The write head is thus connected between the first and second terminals. The H switch is operable to provide write current in a first direction through the write head when the first and fourth transistors are conducting, and to provide write current in a second direction opposite the first direction through the write head when the second and third transistors are conducting. The write circuit further includes a driver circuit for alternately operating the first and fourth transistors and the second and third transistors in conduction. A first active damping assembly is connected to the first terminal, and includes a fifth transistor having a collector connected to the first terminal and an emitter connected to a common electrical potential. A first capacitor is connected between the first terminal and a base of the fifth transistor. A first resistor is connected between the base of the fifth transistor and the common electrical potential. A second active damping assembly is connected to the second terminal, and includes a sixth transistor having a collector connected to the second terminal and an emitter connected to the common electrical potential. A second capacitor is connected between the second terminal and a base of the sixth transistor. A second resistor is connected between the base of the sixth transistor and the common electrical potential.

Another aspect of the present invention is a method of damping ringing in write current flowing through the write head of a disk drive write circuit. The method is carried out by reducing ringing in the voltage at a first terminal of the write head when the write current reverses directions, and involves storing a voltage related to the write current. The method also includes sinking write current from the first terminal in response to a predetermined rate of increase in the stored voltage.

In a preferred form of this aspect of the invention, the sinking of write current is performed by providing a damping circuit connected to the first terminal. The damping circuit is activated in response to the predetermined rate of increase in the stored voltage. The damping circuit is deactivated to provide a high impedance to the first terminal when the rate of increase of the stored voltage is below the predetermined rate.

In another form of this aspect of the invention, the method involves storing a first voltage related to the write current and a second voltage related to the write current. Write current is sunk from the first terminal of the write head in response to a predetermined rate of increase in the first stored voltage. Write current is sunk from the second terminal in response to a predetermined rate of increase in the second stored voltage.

In a further form of this aspect of the invention, the sinking of current from the first and second terminals of the write head is performed by providing a first damping circuit connected to the first terminal, and providing a second damping circuit connected to the second terminal. The first damping circuit is activated in response to a predetermined rate of increase in the first stored voltage. The first damping circuit is deactivated to provide a high impedance to the first terminal when the rate of increase of the first stored voltage is below the predetermined rate. The second damping circuit is activated in response to a predetermined rate of increase in the second stored voltage. The second damping circuit is deactivated to provide a high impedance to the second terminal when the rate of increase of the second stored voltage is below the predetermined rate.

DETAILED DESCRIPTION OF THE PREFERRED EMBODIMENTS

Figure 1:
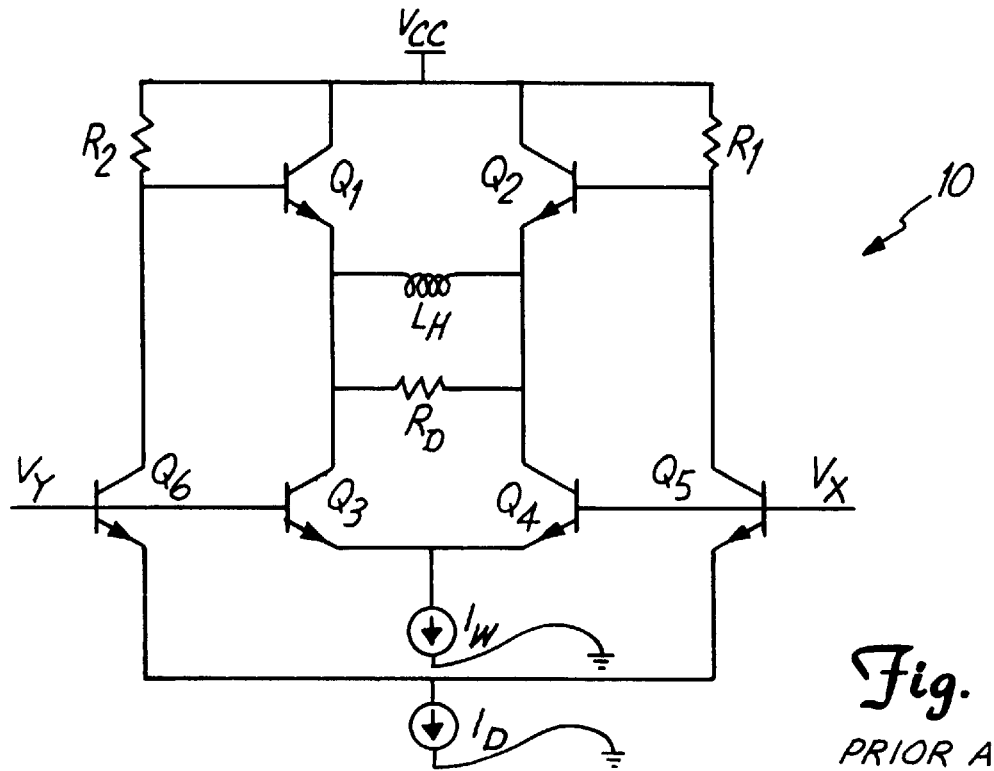
FIG. 1 is a schematic diagram of a prior art write circuit for a disk drive utilizing resistive damping.

FIG. 1 illustrates a write circuit for a disk drive utilizing a prior art resistive damping scheme. The write circuit has an "H" bridge configuration comprising transistors Q1, Q2, Q3 and Q4, head inductance $L_H$, and damping resistor $R_D$. Write pre-driver circuitry comprising transistors Q5 and Q6, and resistors $R_1$ and $R_2$, serves to drive transistors Q1 and Q2 of the "H" bridge in response to differential control signals $V_X$ and $V_Y$. Transistors Q3 and Q4 are driven directly by $V_X$ and $V_Y$.

In operation, transitions are recorded by reversing the direction of write current $I_W$ flowing through write head $L_H$. This is accomplished by alternately driving the bases of transistors Q5 and Q6 high and low so that a high $V_Y$ turns on transistor Q6 and transistor Q3 and turns off transistor Q1, while a low $V_X$ turns off transistor Q5 and transistor Q4 and turns on transistor Q2. With signals $V_Y$ and $V_X$ being oppositely oriented, the "H" bridge of transistors Q1, Q2, Q3 and Q4 alternately provides write current $I_W$ in opposite directions through write head $L_H$. Write current flowing through the "H" bridge transistors and write head $L_H$ is partially shunted around write head $L_H$ through damping resistor $R_D$, which damps the ringing associated with write current $I_W$. However, there are several disadvantages of the resistive damping scheme shown in FIG. 1. The amount of write current $I_W$ flowing through write head $L_H$ is reduced, since some of the write current is diverted through $R_D$. In order to maintain the desired write current flowing through write head $L_H$, a higher value of $I_W$ must be chosen to compensate for the diversion of current through damping resistor $R_D$. Also, damping resistor $R_D$ slows down the rise times for write current transitions. This may not be acceptable for high performance write circuits. Finally, undershoot may still occur in the write current flowing through write head $L_H$, despite reductions in ringing due to damping resistor $R_D$. As a result, the head media may become unsaturated, and asymmetry may be introduced into the circuit due to switching from different current levels. The unsaturated condition and asymmetry negatively affect the overall performance of the write circuit.

Figure 2:
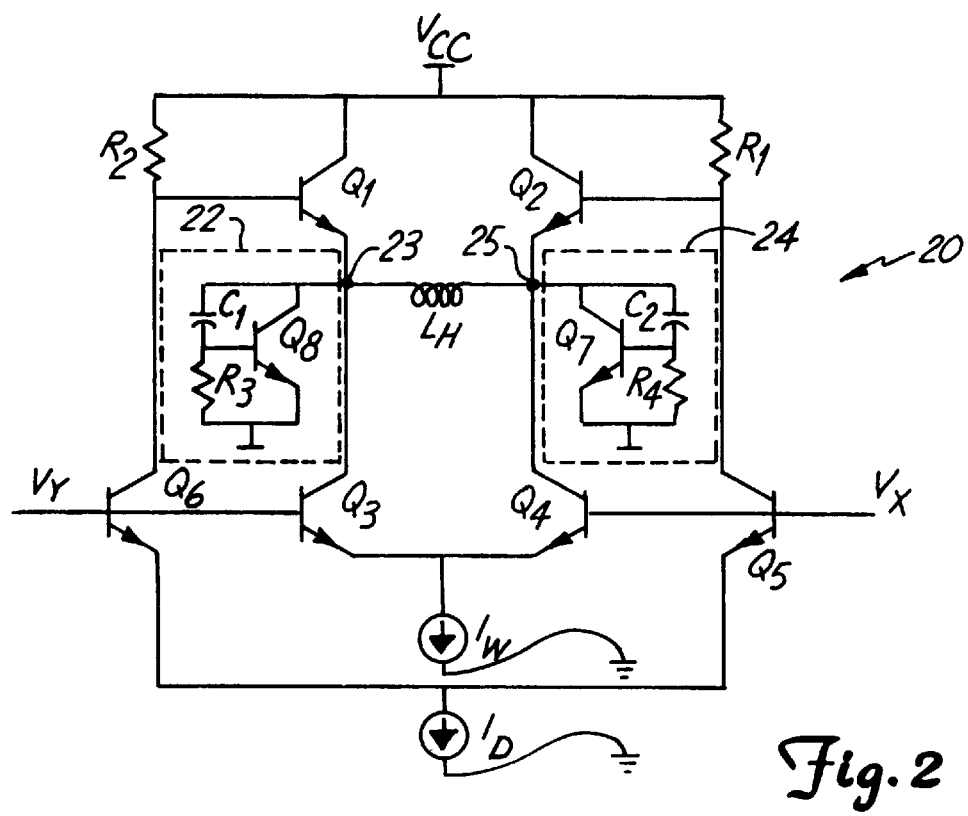
FIG. 2 is a schematic diagram of a write circuit for a disk drive utilizing an active damping network of the present invention.

FIG. 2 illustrates a write circuit utilizing "H" bridge circuitry and pre-driver circuitry similar to FIG. 1, and further implementing the active damping schemes of the present invention rather than a resistive damping scheme. The write circuit 20 comprises a write head $L_H$, "H" bridge transistors Q1, Q2, Q3 and Q4, pre-driver transistors Q5 and Q6, and resistors R1 and R2, all operating as described in FIG. 1. $I_D$ represents the pre-driver current, and $I_W$ represents the write current associated with the write circuit 20. $V_X$ and $V_Y$ are differential control signals controlling the write circuit 20. The circuit 20 shown in FIG. 2 assumes a positive power supply $V_{CC}$ and a ground. The circuit 20 may be modified for a negative power supply and ground, or both a positive and negative power supply. In addition, the "H" bridge circuitry for providing write current through write head $L_H$ is exemplary, and other similar means for providing write current are contemplated by the invention.

Active damping circuits 22 and 24 are connected between opposite terminals 23 and 25 of write head $L_H$ and a common potential, such as ground. Damping circuit 22 comprises transistor Q8 having its collector connected to terminal 23 and its emitter connected to ground. Capacitor C1 is connected between terminal 23 and the base of transistor Q8, and resistor $R_3$ is connected between the base of transistor Q8 and ground. Damping circuit 24 is similarly configured with transistor Q7, capacitor C2 and resistor $R_4$.

The operation of the circuit 20 of FIG. 2 may be explained with reference to the waveforms of FIG. 3. The waveforms shown in FIG. 3 assume a perfect inductive head having a resistance ($R_H$) of zero. Most practical inductive heads have a small resistance associated with them, which does not affect the general operation of the circuit 20. When a quiescent state exists where $V_X$ is high and $V_Y$ is low (waveform 30), transistors Q4 and Q5 will be on, and transistors Q3 and Q6 will be off. Pre-driver current $I_D$ will flow through transistor Q5 and write current $I_W$ will flow through transistor Q4. Because transistor Q6 is off, the voltage at the base of transistor Q1 (waveform 34) will be effectively equal to $V_{CC}$. Therefore, transistor Q1 will be on and the voltage at the base of transistor Q2 (waveform 36) will be $V_{CC}-(I_D \cdot R_1)$. Therefore, transistor Q2 will be off, and current $I_W$ will flow through transistor Q1, write head $L_H$, and transistor Q4. The active damping networks 22 and 24 are not operated in this quiescent state, since capacitors C1 and C2 act as blocking capacitors.

Upon the occurrence of switching $V_Y$ high and $V_X$ low, the pre-driver current $I_D$ is directed through transistor Q6 and starts to pull the voltage at the base of transistor Q1 down to its final point of $V_{CC}-(I_D \cdot R_2)$ (waveform 34). During this transition, transistor Q3 begins to turn on. Because the current through the inductive head $L_H$ cannot change instantaneously, transistor Q1 will still be on, providing a source of current. The voltage at the emitter of transistor Q1 will follow the base of transistor Q1 and begin to drop (waveform 38). Active damping network 22 will still not be on as the voltage at the emitter of transistor Q1 swings low, because the voltage at the base of transistor Q8 falls to a level that is actually slightly lower than the common potential at the emitter of transistor Q8, ensuring that transistor Q8 is turned off. In this inactive state of the active damping network 22, while the voltage at the emitter of transistor Q1 is swinging low, the terminal 23 "sees" a high impedance in the active damping network 22, and rise time of the write current is therefore not affected. As the current through write head $L_H$ switches directions, transistor Q3 begins to sink write current and transistor Q1 turns off. With transistor Q1 off, the voltage at the emitter of transistor Q1 (waveform 38) rises very rapidly, thereby increasing the voltage across capacitor C1 at a relatively high rate and causing current to flow into resistor $R_3$. The current through resistor $R_3$ creates a voltage at the base of transistor Q8 which turns on transistor Q8, which in turn sinks write current at terminal 23. This condition continues until the voltage across the capacitor C1 stops changing, which will occur when the voltage at the emitter of transistor Q1 has nearly settled to its final value. Resistor $R_3$ provides a path to ground to discharge the voltage at the base of transistor Q8 and turn it off. Transistor Q3 appears as a current sink to terminal 23 during the transition, and hence a high impedance. Hence, capacitor C1 discharges through resistor $R_3$ rather than through transistor Q3.

The voltage stored by capacitor C1 is essentially related to the switching characteristics of the write current $I_W$. At the beginning of the transition of reversing write current direction, the voltage stored by capacitor C1 falls. After the transition in write current direction is nearly complete, the voltage stored by capacitor C1 begins to increase at a relatively rapid rate. As the write current begins to settle after completion of the transition, the voltage stored by capacitor C1 also begins to settle, so that the stored voltage has a reduced rate of change. Damping network 22 is only active when the voltage at terminal 23 (and thus the voltage stored by capacitor C1) is increasing at a rate greater than a predetermined threshold, which is set by resistor $R_3$ and capacitor C1. In order to activate damping assembly 22, the change in the voltage stored by capacitor C1 must provide enough current through resistor $R_3$ to create a voltage at the base of transistor Q8 that is high enough to turn transistor Q8 on.

While active, damping network 22 provides a lower total impedance at the emitter of transistor Q1 than would otherwise occur. Transistor Q8 acts as a current sink to pull more write current through the head $L_H$ during the transition, which helps to dampen the ringing that is normally seen in an L-C circuit.

The active damping network 24 consisting of transistor Q7, resistor $R_4$ and capacitor C2 becomes active during the next transition, when current switches direction through the head $L_H$ again, which corresponds to $V_X$ switching high and $V_Y$ switching low. Operation of the write circuit 20 for such transition is a mirror image of the operation previously described for $V_Y$ switching high and $V_X$ switching low.

Figure 3:
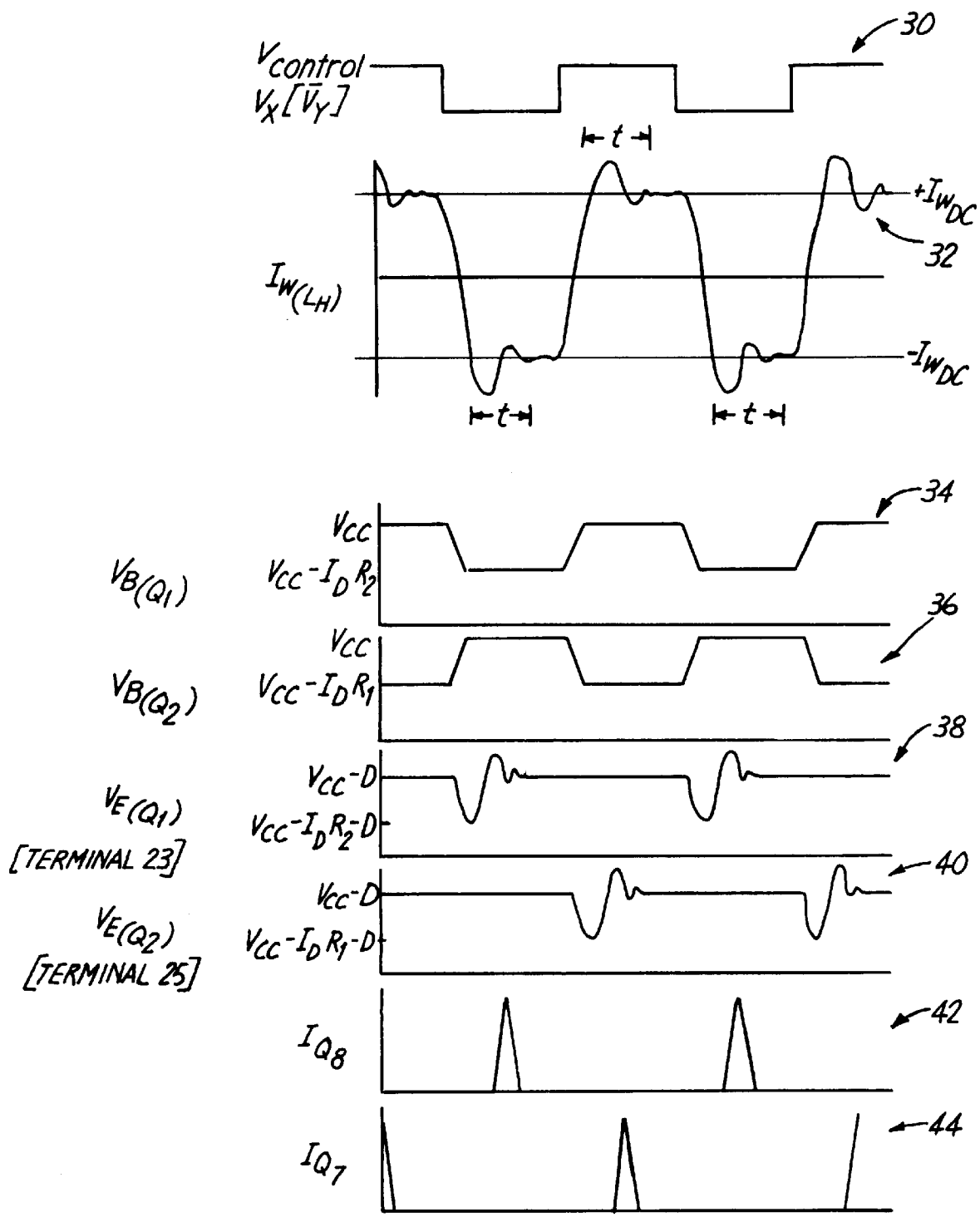
FIG. 3 is a waveform diagram illustrating signals at various points in the write circuitry of FIG. 2.

Waveform 32 in FIG. 3 shows the value of write current flowing through the write head $L_H$ during each transition of control voltage waveform 30. The ringing period 't' for each write current transition is also shown in waveform 32. Waveforms 42 and 44 show the current flowing through transistors Q8 and Q7 of the active damping circuitry 22 and 24, respectively, indicating when the damping circuitry is active and dormant.

Upon a transition in the control voltage 30, the voltages at the bases of transistors Q1 and Q2 switch between $V_{CC}$ and $V_{CC}-(I_D \cdot R_1)$ or $V_{CC}-(I_D \cdot R_2)$. Preferably, resistors $R_1$ and $R_2$ have equal values, so that the voltage swing across the head $L_H$ is symmetric. For the first transition shown in waveform 30, the voltage at the base of transistor Q1 switches low and the voltage at the base of transistor Q2 is pulled high through resistor $R_1$ to the positive power supply. This will cause the voltage at the emitter of transistor Q1 to immediately begin to follow the voltage at the base of transistor Q1 and swing low, as shown in waveform 38. Since the current through an inductive head cannot change simultaneously with the voltage across it, the voltage at the emitter of transistor Q1 (waveform 38) and the voltage at the emitter of transistor Q2 (waveform 40), which are the voltages at the terminals 23 and 25 of the write head $L_H$, will instantaneously differ by $(I_D \cdot R_2)$. The instantaneous voltage at the emitter of transistor Q2 will be at $V_{CC}-D$ (where D is a diode voltage drop), while the instantaneous voltage at the emitter of transistor Q1 will be at $V_{CC}-D-(I_D \cdot R_2)$. The instantaneous voltage across the head $L_H$ is thus $I_D \cdot R_2$; this voltage sets the rise time of the write current, since the write current is related to the voltage across the inductive head $L_H$ as $$V = L \cdot dI_W / dt$$

It can therefore be appreciated that the rise time of the write current is unaffected by any components of the active damping network, since the active damping network is in a state of high impedance while the voltage swing is being set. As discussed above in connection with waveform 38, the write current will eventually switch directions through the write head $L_H$, turning off transistor Q1, and the voltage at the emitter of transistor Q1 will begin to rise rapidly. This voltage transition will have a ringing effect, eventually settling at $V_{CC}-D-I_W \cdot R_H$, where $R_H$ is the resistance of the imperfect inductive head $L_H$, which is ordinarily very small.

The high rate of increase of the voltage at the emitter of transistor Q1 during the transition will result in a large pulse of current flowing through transistor Q8 in the active damping circuitry 22, since capacitor C1 will be conducting current. This is the case because of the relationship between current flow and rate of change of voltage, which is expressed as:

$$I = C \cdot dV/dt$$

This pulse of current sunk by transistor Q8, as shown in waveform 42, indicates the active time of the active damping circuitry 22; it is only active during transitions in the write current $I_W$. Similarly, the active damping circuitry 24 is only active during opposite transitions in the write current $I_W$, as shown by the pulse of current through transistor Q7 in waveform 44. As the voltages at the terminals 23 and 25 increase, transistors Q8 and Q7 sink current to counteract the voltage increase, which helps to settle the voltage at the terminals 23 and 25 of the write head $L_H$, which in turn reduces the settling time of the write current $I_W$, by effectively clamping the voltage across the inductive head $L_H$. Thus, the active damping circuitry 22 and 24 operates only when it is needed (during write current transitions), and effectively reduces the settling time experienced in the write current $I_W$ without affecting its rise time.

Figure 4:
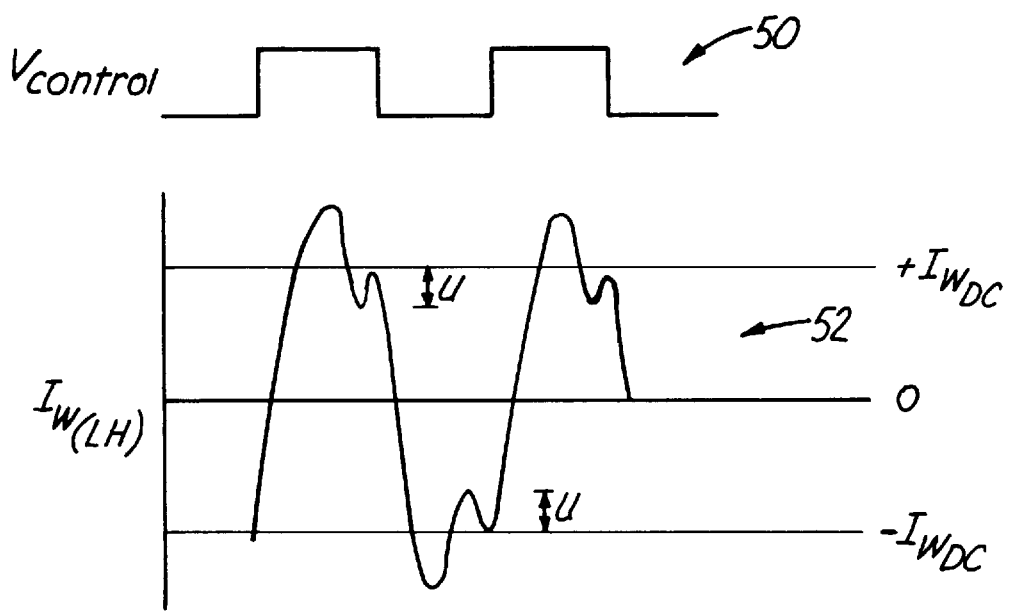
FIG. 4 is a waveform diagram illustrating a write current signal where control voltage transitions occur so quickly that the write current signal does not have time to completely settle.

FIG. 4 shows the write current $I_W$ waveform 52 where successive control voltage transitions 50 occur in circuit 20 before the write current waveform 52 has time to fully settle, such as in double timing of transitions. It is important in this situation to minimize the undershoot (U) so that the write current begins to switch from as close to its final DC value as possible, even if a transition occurs while the write current is still ringing. If undershoot (U) is too large, the head media may lose saturation, which is highly undesirable and results in poor encoding of data. Also, where there is significant undershoot, the write current may begin switching from a point which is somewhere on the undershoot curve, which is difficult to predict accurately and can reduce the accuracy of bit placement in the bit cell during the writing of data. The circuit 20 of the present invention maintains the undershoot (U) at a relatively low value, ensuring that write current $I_W$ begins switching from approximately the same point during each control voltage transition, resulting in consistent bit placement in bit cell intervals and better write circuit performance.

While not expressly shown, the present invention can be modified to implement PNP transistors (with appropriately modified supply levels and write circuitry) to achieve similar reduction in ringing of the write current.

Although the present invention has been described with reference to preferred embodiments, workers skilled in the art will recognize that changes may be made in form and detail without departing from the spirit and scope of the invention.

What is claimed is:

1. In a disk drive write circuit for supplying write current to a write head, the circuit having first and second terminals for connection to the write head so that write current flows in a first current path through the write head between the first and second terminals, an active damping assembly forming a second current path, separate from the first current path, and comprising:

a transistor having a first controlled element connected to the first terminal and having a second controlled element connected to a common electrical potential;

a capacitor connected between the first terminal and a control element of the transistor; and a resistor connected between the control element of the transistor and the common electrical potential.

2. Apparatus as in claim 1, further comprising a second active damping assembly forming a third current path, separate from the first current path, and having:

a second transistor having a third controlled element connected to the second terminal and having a fourth controlled element connected to the common electrical potential, a second capacitor connected between the second terminal and a second control element of the second transistor, and a second resistor connected between the second control element of the second transistor and the common electrical potential.

3. A disk drive write circuit comprising:

an H switch having first, second, third and fourth transistors arranged so that an emitter of the first transistor and a collector of the second transistor are connected to a first terminal for connection to a first side of a write head and an emitter of the third transistor and a collector of the fourth transistor are connected to a second terminal for connection to a second side of the write head, the first, second, third and fourth transistors being operable to provide write current in a first direction through a write head connected between the first and second terminals when the first and fourth transistors are conducting and to provide a write current in a second direction through the write head opposite to the first direction when the second and third transistors are conducting;

a driver circuit for operating the first, second, third and fourth transistors to alternately operate the first and fourth transistors and the second and third transistors in conduction;

a first active damping assembly having:
a fifth transistor having a collector connected to the first terminal and having an emitter connected to a common electrical potential,
a first capacitor connected between the first terminal and a base of the fifth transistor, and
a first resistor connected between the base of the fifth transistor and the common electrical potential; and a second active damping assembly having:
a sixth transistor having a collector connected to the second terminal and having an emitter connected to the common electrical potential,
a second capacitor connected between the second terminal and a base of the sixth transistor, and
a second resistor connected between the base of the sixth transistor and the common electrical potential.

4. A disk drive write circuit comprising:

first and second terminals for connection to a write head;

means for selectively directing write current in a first current path through the write head between the first and second terminals in a first direction and in a second direction opposite the first direction, the means for selectively directing write current introducing ringing current into the write current during a transition between the first and second directions of the write current; and an active damping assembly forming a second current path, separate from the first current path, and comprising:

first capacitive means connected to the first terminal for storing a voltage related to the write current;

first transistor means having a controlled element connected to the first terminal and a control element connected to the first capacitive means, the first transistor means sinking write current in response to a predetermined rate of increase in the stored voltage; and first discharge means connected to the first transistor means for discharging a voltage at the control element of the first transistor means when the rate of increase of the stored voltage is below the predetermined rate.

5. The disk drive write circuit of claim 4 further comprising a second active damping assembly forming a third current path, separate from the first current path, and comprising:

second capacitive means connected to the second terminal for storing a second voltage related to the write current;

second transistor means having a controlled element connected to the second terminal and a control element connected to the second capacitive means, the second transistor means sinking write current in response to a second predetermined rate of increase in the second stored voltage; and second discharge means connected to the second transistor means for discharging a voltage at the control element of the second transistor means when the rate of increase of the second stored voltage is below the second predetermined rate.

6. The disk drive write circuit of claim 4 wherein rise time of the write current during a transition in direction of the write current is determined by the means for selectively directing write current through the write head.

7. A method of damping ringing in a write current flowing through a write head between first and second terminals by reducing ringing in voltage at the first terminal of the write head when the write current reverses polarity, the method comprising:

storing a first voltage related to the write current at the first terminal; and sinking write current from the first terminal through a first active element in response to a predetermined rate of increase in the first stored voltage by activating the first active element in response to the predetermined rate of increase in the first stored voltage and deactivating the first active element to provide a high impedance to the first terminal when the rate of increase of the first stored voltage is below the predetermined rate.

8. The method of claim 7 further comprising:

storing a second voltage related to the write current at the second terminal; and sinking write current from the second terminal through a second active element in response to a predetermined rate of increase in the second stored voltage by activating the second active element in response to the predetermined rate of increase in the second stored voltage and deactivating the second active element to provide a high impedance at the second terminal when the rate of increase of the second stored voltage is below the predetermined rate.

9. A method of damping ringing in a write current flowing through a write head between first and second terminals by reducing ringing in a voltage at the first terminal of the write head when the write current reverses polarity, the method comprising:

storing a first voltage related to the write current at the first terminal;

providing a first active element connected between the first terminal and a first fixed voltage level; and sinking write current from the first terminal to the first fixed voltage level in response to a predetermined rate of increase in the first stored voltage by activating the first active element in response to the predetermined rate of increase in the first stored voltage and deactivating the first active element to provide a high impedance to the first terminal when the rate of increase of the first stored voltage is below the predetermined rate.

10. The method of claim 9 further comprising:

storing a second voltage related to the write current at the second terminal;

providing a second active element connected between the second terminal and a second fixed voltage level; and sinking write current from the second terminal to the second fixed voltage level in response to a predetermined rate of increase in the second stored voltage by activating the second active element in response to the predetermined rate of increase in the second stored voltage and deactivating the second active element to provide a high impedance at the second terminal when the rate of increase of the second stored voltage is below the predetermined rate.

* * * * *